(12) United States Patent
Herman et al.

(10) Patent No.: US 6,181,551 B1
(45) Date of Patent: Jan. 30, 2001

(54) PIN SOLDERING ENHANCEMENT AND METHOD

(75) Inventors: Patricia Herman, Austin; David Scott Green, Taylor, both of TX (US)

(73) Assignee: Dell USA, L.P., Round Rock, TX (US)

( * ) Notice: Under 35 U.S.C. 154(b), the term of this patent shall be extended for 0 days.

(21) Appl. No.: 09/060,701

(22) Filed: Apr. 15, 1998

(51) Int. Cl.[7] ..................................................... H05K 1/11
(52) U.S. Cl. .......................... 361/684; 361/698; 257/738; 174/260
(58) Field of Search .................................. 361/684, 685, 361/686, 698; 257/738, 758, 781, 621; 174/260, 261, 262, 263, 265

(56) References Cited

U.S. PATENT DOCUMENTS

| | | | |
|---|---|---|---|
| 4,127,830 | * 11/1978 | Chalifour et al. | 333/7 D |
| 4,316,171 | * 2/1982 | Miyabayashi et al. | 338/21 |
| 4,453,033 | * 6/1984 | Duff et al. | 174/52 |
| 4,654,102 | 3/1987 | Wery et al. | 156/250 |
| 5,371,653 | * 12/1994 | Kematani et al. | 361/721 |

\* cited by examiner

*Primary Examiner*—Leo P. Picard
*Assistant Examiner*—Hung Van Duong
(74) *Attorney, Agent, or Firm*—Haynes and Boone, L.L.P.

(57) ABSTRACT

A multi-layer circuit board includes several metallic layers. Each metallic layer includes a metallic ring surrounding a component pin hole formed through each layer of the board. The ring is isolated from its respective metallic layer by a concentric gap formed of non-metallic material. A plurality of metallic traces interconnect each ring with its respective metallic layer. The traces extend radially outwardly from the ring and segment the gap. Each trace has a width of about 0.010 mils and a length of about 0.050 mils.

17 Claims, 4 Drawing Sheets

PIN SOLDERING ENHANCEMENT AND METHOD

BACKGROUND

The disclosures herein relate generally to circuit boards and more particularly to a soldering enhancement for bonding the pins of the circuit board components in the pin holes formed through the multiple board layers.

A common method of soldering components on a circuit board, such as a motherboard used in a computer, is a wave solder process. A multi-layer board includes through holes. Component pins are inserted into a bore or barrel formed by the through holes. The board is pre-heated and then moved by a conveyor at a preset speed across a molten solder pot. The component pins which extend beyond the underside of the board are soldered to the board when contacted by the wave of solder. Thus, there is a critical time of exposure controlled by the speed of the board and a critical temperature of the solder material.

As the solder contacts the protruding component pins, the solder wicks up by capillary action through the barrel and along the pins. Ultimately, the solder material reaches the top side of the board where the pins connect to their host component which is being soldered to the board. As the pins pass through the various board layers, the pins are bonded to certain layers. This is accomplished by a copper pad surrounding the hole. The pad is tied, i.e. electrically connected, to a copper plane in the board layers and to each other component tied to the plane. The ties between the pad and the copper plane are copper traces.

This is illustrated in U.S. Pat. No. 4,654,102 wherein a component pin is inserted through a bore formed in a multi-layer board. Solder material is wicked upward through the bore by a wave solder or flow solder process to secure the component pin in the bore.

The copper traces also conduct heat away from the solder material while it wicks up through the barrel. Because the circuit boards are multi-layered, the more copper layers contacting the pin, the more heat is conducted away from the solder. Thus, it sometimes occurs that the solder cools sufficiently so as to solidify before the wicking up process is completed. In such a case, a weak physical bond may occur between the pin and the hole but no molecular bond is achieved by the solder material. In fact, the weak bond may even fail due to handling during installation.

Certain components compound the solder cooling problem. For example, aluminum electrolyte caps, which have a substantial mass of metal and fluid, act as a heat shield during pre-heating and wave soldering. The caps are part of the voltage regulating circuity that assist in running the processor. If the caps are not properly soldered and fail, the processor will fail causing a shut down of the system being controlled by the board.

Therefore, what is needed is a device and a method for providing proper wicking up of solder material in the solder barrel formed in a multi-layer circuit board which avoids premature cooling of the solder material.

SUMMARY

On embodiment, accordingly, enhances solder flow and wicking up by retaining heat at the pad site surrounding the pin connections of components being soldered onto the board. To this end, a pad site in a multi-layer circuit board includes a metallic ring surrounding a pin hole formed in a metallic layer of the board. The ring is isolated from the layer by a gap formed of non-metallic material. A plurality of metal traces interconnect the ring and the layer. The traces extend radially outwardly from the ring and segment the gap. Each trace has a width of about 0.010 mils and has a length of about 0.050 mils.

A principal advantage of this embodiment is that the gap forms a thermal barrier around the pad site and isolates the pad site from the metallic layer. Thus, heat is retained at the pad site long enough to permit a good solder bond. The length and width of the traces permit current to flow between the pin and the layer and delay the heat dissipation from the solder barrel around the component pin.

DETAILED DESCRIPTION OF THE PREFERRED EMBODIMENT

Figure 1:
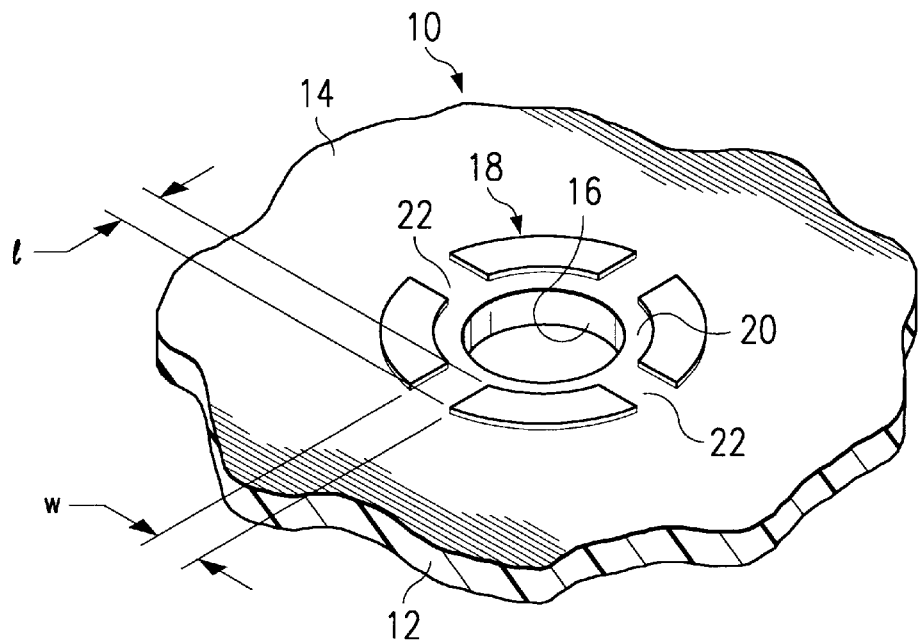
FIG. 1 is an isometric view illustrating a prior art, pad site.

A prior art pad site 10 is illustrated in FIG. 1 and includes a known glass substrate 12 including a conductive metallic layer 14, e.g. copper, thereon. A hole 16 is formed through the substrate 12 and the copper layer 14. A concentric gap of non-metallic material is formed by a segmented ring 18 formed of the glass substrate 12 excluding the metallic layer 14. A metallic ring 20 surrounds hole 16. A plurality of metallic traces 22 interconnect the metallic ring 20 with the layer 14. The traces 22 extend radially outwardly from the hole 16. The width w of each trace 22 is about 0.020 mils and the length 1 of each trace 22 is about 0.010 mils. In forming hole 16, the hole diameter is determined by the diameter of the component lead or pin which will extend through hole 16. The length 1 and width w of each trace is generally constant. Due to the present constant width w and length 1 of the traces, a substantial amount of heat is conducted away from solder material in hole 16 toward layer 14.

Figure 2:
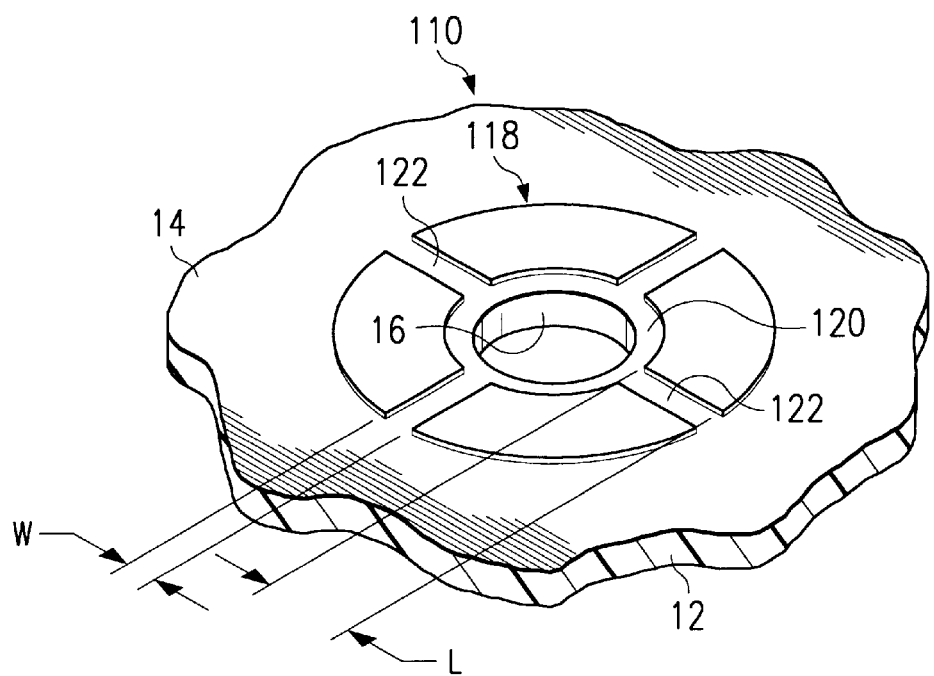
FIG. 2 is an isometric view illustrating an embodiment of a novel heat retaining pad site.

Accordingly, in order to resist conducting substantial amount of heat away from hole 16, a pad site 110, FIG. 2, includes glass substrate 12 including a conductive metallic layer 14. Hole 16 is formed through the substrate 12 and the copper layer 14. A concentric gap of non-metallic material is formed around a metallic ring 120 by a segmented ring 118 formed of the glass substrate 12 excluding the metallic layer 14. Metallic ring 120 surrounds hole 16. A plurality of metallic traces 122 extend radially outwardly from the ring 120. The width W of each trace 122 is about 0.010 mils and the length L of each trace is about 0.050 mils. Thus, due to the reduced width W and increased length L of the traces 122, the amount of heat conducted away from solder material 16 toward layer 14 in a given period is substantially reduced over the prior art traces 22, FIG. 1. Thus, the reduction of heat conducted away from the solder material provides for heat retention by solder material and proper wicking up of the solder material.

Figure 3:
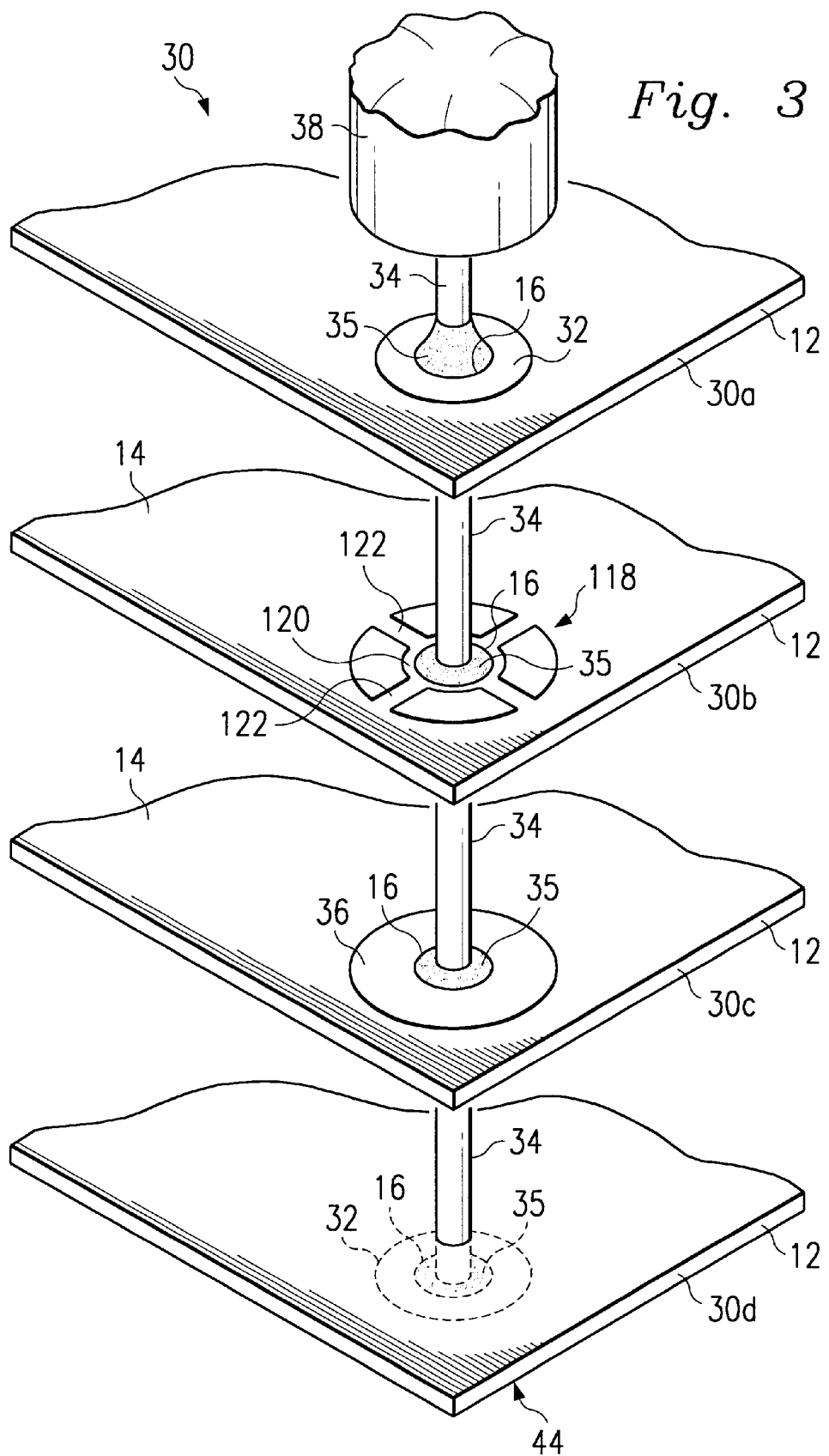
FIG. 3 is an exploded partial isometric view illustrating an embodiment of a component pin extending through various board layers.

An exploded view of a multi-layer stack forming a board 30 is illustrated in FIG. 3, including a primary layer 30a, a plane layer 30b, another plane layer 30c and a secondary layer 30d. Layer 30a includes a copper pad 32 formed on glass substrate 12 around hole 16 formed therethrough. Layer 30b includes copper layer 14 formed on substrate 12. Hole 16 is formed through substrate 12 and copper layer 14. Segmented ring 118 of glass substrate 12 surrounds metallic ring 120 which, in turn, surrounds hole 16. Traces 122 extend radially outwardly from ring 120 to interconnect ring 120 and copper layer 14. Layer 30c includes a non-metallic ring 36 of substrate material 12 formed in copper layer 14 concentrically surrounding hole 16. Layer 30d includes, on a bottom side 44 thereof, as indicated in phantom outline, a copper pad 32 formed on glass substrate 12 around hole 16 formed therethrough. A component 38 includes a lead or pin 34 extending therefrom through each hole 16 in layers 30a–30d. Solder material 35 secures pin 34 in each hole 16.

Figure 4:
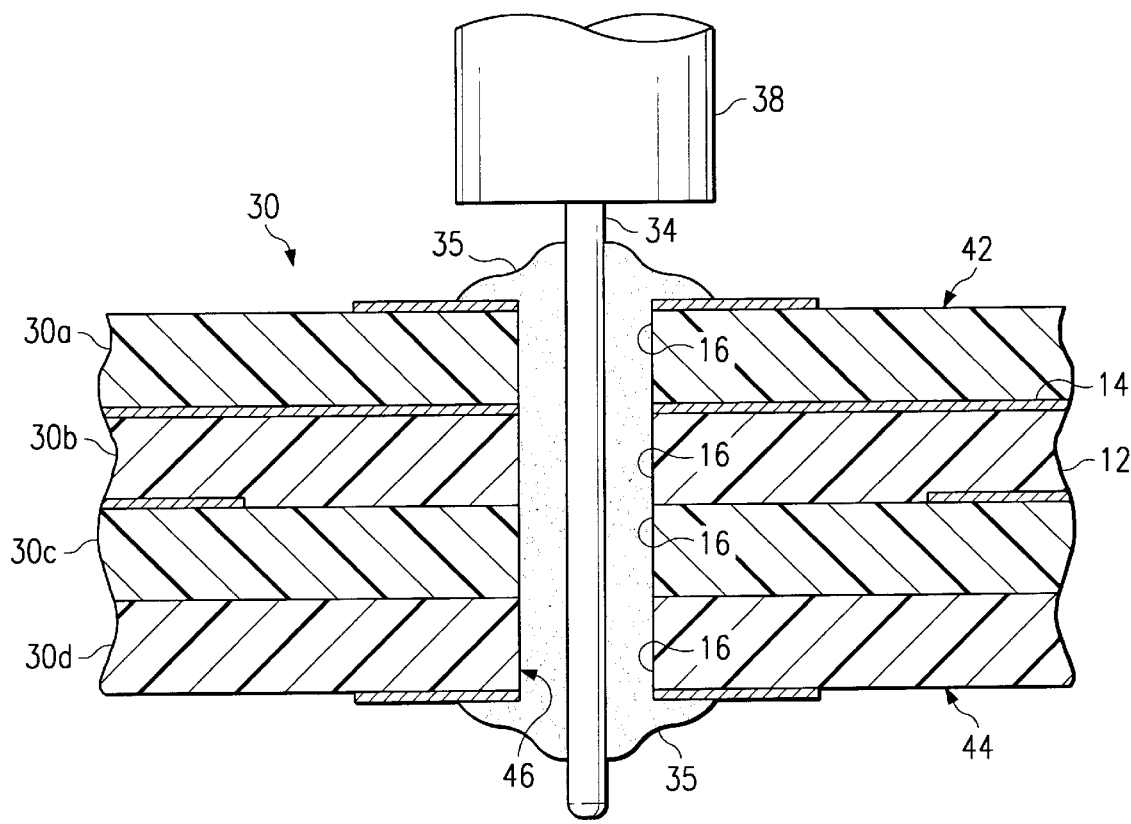
FIG. 4 is a partial cross sectional side view illustrating an embodiment of a component pin soldered in a bore hole in a multi-layer board.

In FIG. 4, component 38 is soldered on a primary side 42 of board 30 including layers 30a–30d. Lead 34 extends to protrude from a secondary side 44 of board 30. A solder barrel 46 is formed by aligned holes 16 in each of the layers 30a–30d. In the known wave soldering process, solder material 35 wicks up through solder barrel 46 to secure lead 34 in barrel 46. Pin 34 of component 38 is electrically connected to copper layer 14 on substrate 12 of plane layer 30b.

As a result of the foregoing, pad site 110, FIG. 2, is provided in a multi-layer circuit board 30. Pad site 110 includes metallic ring 120 surrounding pin hole 16 formed in metallic layer 14 of substrate 12. Ring 120 is thermally restricted from layer 14 by segmented ring 118 formed of substrate material 12. The plurality of metallic traces 122 interconnect ring 120 and layer 14. Traces 122 extend radially outwardly from ring 120 and form segmented ring 118. Each trace 122 has a width W of about 0.010 mils and a length L of about 0.050 mils. The 0.010 mil width W and 0.050 mil length L are nominal or preferred dimensions. Additionally, a maximum width W of 0.012 mils and a minimum length L of 0.050 are believed to substantially enhance heat retention in solder barrel 46, FIG. 4.

Figure 5:
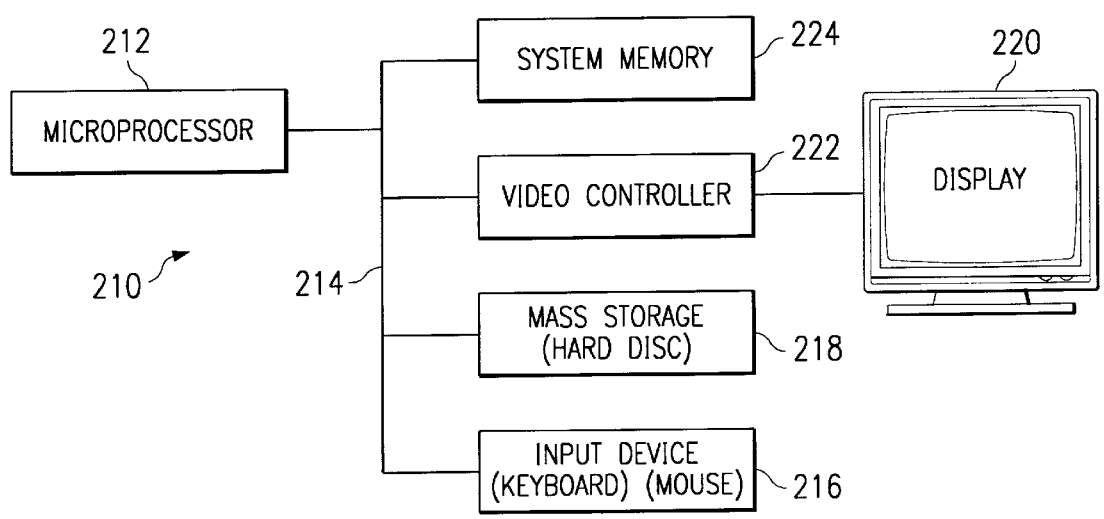
FIG. 5 is a diagrammatic view illustrating an embodiment of a computer system.
Figure 6:
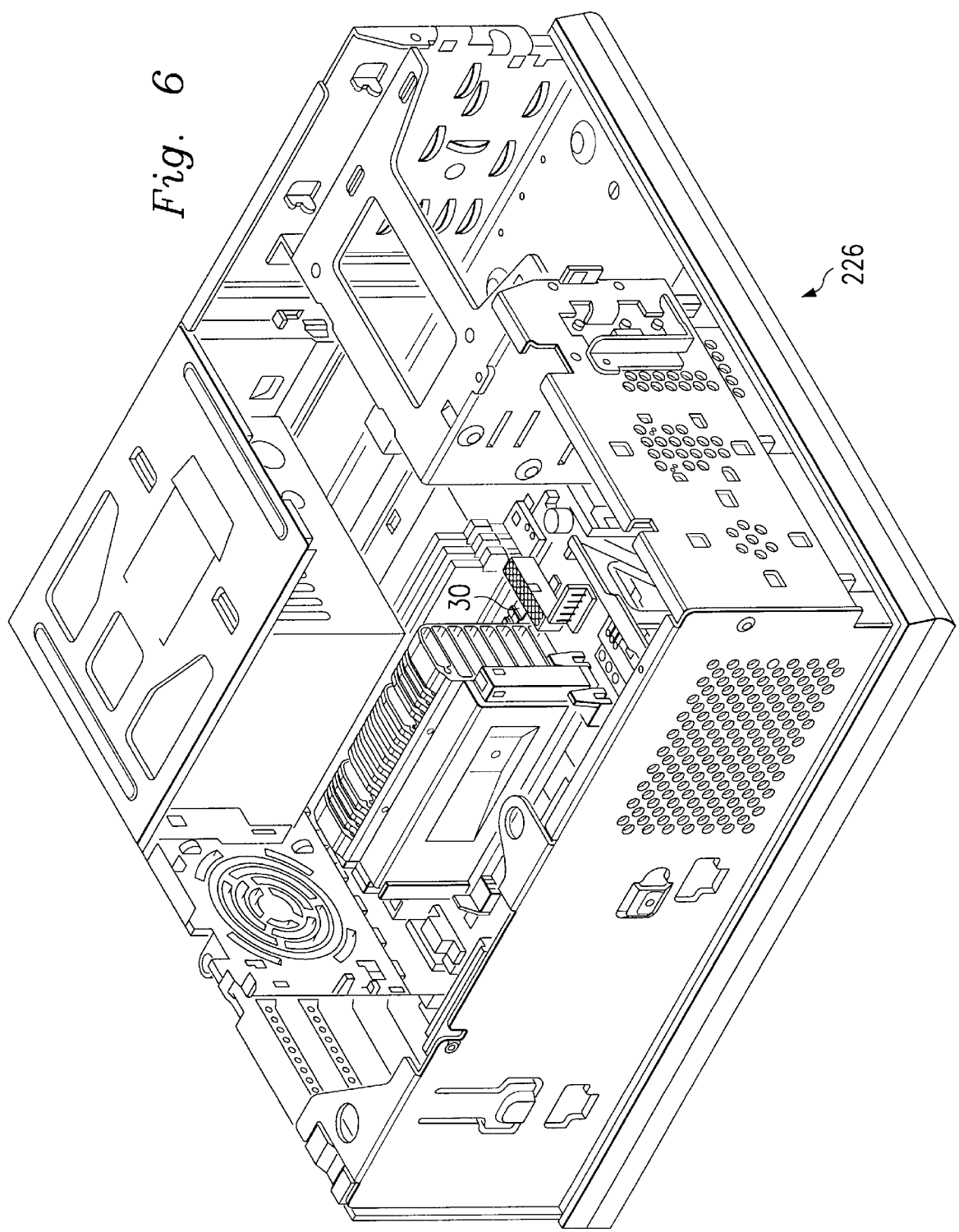
FIG. 6 is an isometric view of a computer chassis having a circuit board mounted therein.

Pad site 110, FIG. 2, is used in circuit boards of the type used in a computer system. In FIG. 5, a computer system 210 includes a microprocessor 212, which is connected to a bus 214. Bus 214 serves as a connection between microprocessor 212 and other components of computer system 210. An input device 216 is coupled to microprocessor 212 to provide input to microprocessor 212. Examples of input devices include keyboards, touchscreens, and pointing devices such as mouses, trackballs and trackpads. Programs and data are stored on a mass storage device 218, which is coupled to microprocessor 212. Mass storage devices includes such devices as hard disks, optical disks, magneto-optical drives, floppy drives and the like. Computer system 210 further includes a display 220, which is coupled to microprocessor 212 by a video controller 222. A system memory 224 is coupled to microprocessor 212 to provide the microprocessor with fast storage to facilitate execution of computer programs by microprocessor 212. It should be understood that other busses and intermediate circuits can be deployed between the components described above and microprocessor 212 to facilitate interconnection between the components and the microprocessor. In FIG. 6, a chassis 226 of system 210 includes circuit board 30 mounted therein.

In operation, board 30 includes component 38 mounted thereon having pin 34 extending through solder barrel 46. Lead 34 extends from secondary side 44 of board 30. Board 30 is pre-heated and moved by a conveyor at a preset speed across a molten solder pot. Lead 34 is soldered to board 30 when contacted by the wave of solder which wicks up through solder barrel 46 by capillary action. Due to enhanced heat retention in solder barrel 46, the solder material reaches primary side 42 of 45 board 30. The heat retention is enhanced due to the limited heat conduction away from solder barrel 46 via narrowed and lengthened metallic traces 122.

It should be understood that several combinations of layers of board laminations and planes are possible and that the advantages of the improved pad site 122 may apply to such combinations. This improvement is beneficial in situations utilizing a single trace or many traces. Also, any board requiring a capacitor in a through-hole component form, such as a power supply, for example, can benefit from this improvement.

A principal advantage of this embodiment is that the non-metallic gaps form a thermal barrier around the pad site and isolate the pad site from the metallic layer. Thus, heat is retained at the pad site long enough to permit a good solder bond. The length and width of the traces permit current to flow between the pin and the layer and also delay the heat dissipation from the solder barrel around the component pin during the solder process.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A computer comprising:

a chassis;

a multi-layer circuit board mounted in the chassis, the board including a plurality of metallic layers;

each metallic layer including a metallic ring surrounding a pin hole formed through each layer of the board, the ring being insulated from its respective metallic layer by a concentric gap formed by non-metallic material; and a plurality of metallic traces interconnecting each ring with its respective layer, the traces extending radially outwardly from the ring and segmenting the gap, each trace having a width of from 0.010 mils to 0.012 mils and a length of at least 0.050 mils.

2. The computer as defined in claim 1 wherein the circuit board comprises at least a primary layer, first and second plane layers, and a secondary layer.

3. The computer as defined in claim 2 wherein the primary layer includes a conductive pad formed on a non-conductive substrate.

4. The computer as defined in claim 2 further including a component having a lead extending through the pin hole and through each layer of the circuit board.

5. The computer as defined in claim 3 wherein the first plane layer includes a conductive layer.

6. The computer as defined in claim 5 wherein the second plane layer includes a non-conductive ring of substrate material formed in a conductive layer.

7. The computer as defined in claim 6 wherein the secondary layer includes a conductive pad on a non-conductive substrate.

8. A computer system comprising:

a microprocessor;

an input coupled to provide input to the microprocessor;

a mass storage coupled to the microprocessor;

a video controller coupled to the microprocessor;

a memory coupled to provide storage to facilitate execution of computer programs by the microprocessor;

a multi-layer circuit board including a plurality of metallic layers;

each metallic layer including a metallic ring surrounding a pin-hole formed through each layer of the board, the ring being insulated from its respective metallic layer by a concentric gap formed of non-metallic material; and a plurality of metallic traces interconnecting each ring with its respective metallic layer, the traces extending radially outwardly from the ring and segmenting the gap, each trace having a width of at least 0.010 mils and a length of at least 0.050 mils.

9. The computer system as defined in claim 8 wherein the circuit board comprises at least a primary layer, first and second plane layers, and a secondary layer.

10. The computer system as defined in claim 9 wherein the primary layer includes a conductive pad formed on a non-conductive substrate.

11. The computer system as defined in claim 9 further including a component having a lead extending through the pin hole and through each layer of the circuit board.

12. The computer system as defined in claim 10 wherein the first plane layer includes a conductive layer.

13. The computer system as defined in claim 12 wherein the second plane layer includes a non-conductive ring of substrate material formed in a conductive layer.

14. The computer system as defined in claim 13 wherein the secondary layer includes a conductive pad on a non-conductive substrate.

15. A pad site in a circuit board comprising:

a multi-layer circuit board including a plurality of metallic layers;

each metallic layer including a metallic ring surrounding a pin-hole formed through each layer of the board, the ring being insulated from its respective metallic layer by a concentric gap formed of non-metallic material; and a plurality of metallic traces interconnecting each ring with its respective layer, the traces extending radially outwardly from the ring and segmenting the gap, each trace having a width of at least 0.010 mils and a length of at least 0.050 mils.

16. The pad site as defined in claim 15 wherein the circuit board comprises at least a primary layer, first and second plane layers, and a secondary layer.

17. The pad site as defined in claim 16 further including a component having a lead extending through the pin hole and through each layer of the circuit board.

* * * * *